(12) United States Patent
Albsmeier et al.

(10) Patent No.: US 8,965,734 B2
(45) Date of Patent: Feb. 24, 2015

(54) DIAGNOSTIC METHOD FOR AN ENGINE-GENERATOR SET

(75) Inventors: Eric D. Albsmeier, Sheboygan, WI (US); Kenneth R. Bornemann, Cato, WI (US); Harrison Chirkdo Chiu, Grafton, WI (US); Zane Eaton, Plymouth, WI (US); Anthony James Hackbarth, Sheboygan, WI (US); Richard Allen Mauk, Sheboygan, WI (US); Jeffrey John Neis, Sheboygan, WI (US); Edward Douglas Brey, Sheboygan Falls, WI (US)

(73) Assignee: Kohler Co., Kohler, WI (US)

( * ) Notice: Subject to any disclaimer, the term of this patent is extended or adjusted under 35 U.S.C. 154(b) by 574 days.

(21) Appl. No.: 13/007,091

(22) Filed: Jan. 14, 2011

(65) Prior Publication Data

US 2011/0172966 A1    Jul. 14, 2011

Related U.S. Application Data

(60) Provisional application No. 61/294,870, filed on Jan. 14, 2010.

(51) Int. Cl.
  *G06F 11/30* (2006.01)
  *G21C 17/00* (2006.01)
  (Continued)

(52) U.S. Cl.
  CPC ........... *G01M 15/046* (2013.01); *G01R 31/343* (2013.01)
  USPC ...................... 702/183; 73/114.41; 73/114.56; 73/114.68

(58) Field of Classification Search
  USPC .............. 702/183; 73/114.68, 114.56, 114.41
  See application file for complete search history.

(56) References Cited

U.S. PATENT DOCUMENTS 3,938,377 A * 2/1976 Converse et al. ........... 73/114.71
4,282,747 A * 8/1981 Holzinger .................. 73/114.25
(Continued)

FOREIGN PATENT DOCUMENTS

DE  10323145      12/2004
DE  10323145 A1   12/2004
(Continued)

OTHER PUBLICATIONS

PCT/US2011/021310 International Preliminary Report on Patentability and Written Opinion of the International Searching Authority dated Jul. 17, 2012, 9 pages.

*Primary Examiner* — John Breene
*Assistant Examiner* — Manuel Rivera Vargas
(74) *Attorney, Agent, or Firm* — Michael Best & Friedrich LLP

(57) ABSTRACT

A diagnostic test is conducted by operating an engine-generator set at a plurality of reduced speeds. At each of those speeds, operating parameters of the engine are sensed and analyzed to detect an unsatisfactory operating condition. For example, such operating parameters may include speed of the engine-generator set, engine oil pressure and level, engine temperature, coolant level, and battery voltage. When a transition in engine speed occurs, a throttle test also may be conducted to measure how quickly and smoothly the engine reaches the new speed. After the engine reaches the normal operating speed, the generator is activated to produce electricity. One or more characteristic of that electricity, such as voltage, current and frequency, are sensed and evaluated to detect an unsatisfactory operating condition.

25 Claims, 9 Drawing Sheets

(51) Int. Cl.
    *G01M 15/00*     (2006.01)
    *G01M 15/04*     (2006.01)
    *G01R 31/34*     (2006.01)

(56) References Cited

U.S. PATENT DOCUMENTS

| | | | |
|---|---|---|---|
| 4,442,385 | A | 4/1984 | Van Sickle |
| 4,951,627 | A | 8/1990 | Watanabe et al. |
| 5,144,232 | A | 9/1992 | Veenstra |
| 5,256,959 | A | 10/1993 | Nagano et al. |
| 5,320,077 | A | 6/1994 | Kamiya et al. |
| 5,504,417 | A | 4/1996 | Kern et al. |
| 5,539,258 | A | 7/1996 | Sutton et al. |
| 5,703,410 | A | 12/1997 | Maekawa |
| 5,949,247 | A | 9/1999 | Lima et al. |
| 5,973,481 | A | 10/1999 | Thompson et al. |
| 5,998,880 | A | 12/1999 | Kumar |
| 6,118,186 | A | 9/2000 | Scott et al. |
| 6,198,256 | B1 | 3/2001 | Miyazaki et al. |
| 6,555,929 | B1 | 4/2003 | Eaton et al. |
| 6,580,284 | B1 | 6/2003 | Eckardt |
| 6,624,528 | B2 | 9/2003 | Shimizu et al. |
| 6,657,416 | B2 | 12/2003 | Kern et al. |
| 6,740,986 | B2 | 5/2004 | Shimizu et al. |
| 6,840,203 | B2 | 1/2005 | Wakitani et al. |
| 7,230,345 | B2 | 6/2007 | Winnie et al. |
| 2001/0049579 | A1* | 12/2001 | Fujino et al. .......... 701/114 |
| 2004/0059542 | A1 | 3/2004 | Apostolides |
| 2010/0066551 | A1 | 3/2010 | Bailey et al. |

FOREIGN PATENT DOCUMENTS

| | | |
|---|---|---|
| FR | 2529674 | 1/1984 |
| FR | 2529674 A1 | 1/1984 |

* cited by examiner

DIAGNOSTIC METHOD FOR AN ENGINE-GENERATOR SET

CROSS-REFERENCE TO RELATED APPLICATION

This application claims benefit of U.S. provisional patent application No. 61/294,870 filed on Jan. 14, 2010.

STATEMENT CONCERNING FEDERALLY SPONSORED RESEARCH OR DEVELOPMENT

Not applicable.

BACKGROUND OF THE INVENTION

1. Field of the Invention

The present invention relates to electrical engine-generator sets and more particularly to methods for performing diagnostic tests on an electrical engine-generator set.

2. Description of the Related Art

Homes and commercial buildings commonly have an electrical backup generator system in which an internal combustion engine drives an electrical alternator that provides electricity when power is unavailable from an electric utility company. A controller responds to the interruption of the utility company power by automatically starting the engine. When the alternator reaches the nominal speed at which electricity properly is produced, the controller activates an automatic transfer switch to disconnect selected electrical circuits within the building from the utility power lines and connect those circuits to the output of the alternator. When the controller senses restoration of the utility company power, the automatic transfer switch operates to reconnect the building electrical circuits to the utility company lines and then turn off the engine.

Most of these backup electrical generator systems can sit idle for long periods of time, e.g. many months, between events when the backup electricity is required. During such periods of inactivity, problems may arise that adversely affect the ability of the generator system to produce power when needed. This is especially true with home installations that usually are not tested by the homeowner. As a result, it is desirable to have the backup generator system automatically perform self-diagnostic tests on a periodic basis. If problems are detected, the controller should alert building occupants and remote service personnel so that servicing of the system can be performed in a timely manner.

Engine-generator sets previously were periodically operated at less than full speed in order to exercise the mechanical components without producing a high noise level. Nevertheless, diagnostic tests heretofore were performed only by operating the engine-generator set at full normal speed for a prolonged time in order to determine that the engine and alternator were performing within predefined operational tolerances and that the control and regulatory systems were functioning properly. Such full speed operation, however, produced a high level of noise, which was found to be objectionable to homeowners and occupants of other types of buildings. As a result, it is desirable to be able to perform full diagnostics on the engine-generator set without producing an objectionable level of noise.

In some instances, an engine generator operated at low speed for the purpose of warming up or circulating engine fluids. Diagnostics were later performed at full speed with some level of electrical loading.

In addition, generators were exercised at a preset time as determined by an automated transfer switch controller or separate modular timer.

The results of the diagnostic operation and alerts, when faults were detected, were provided to remote locations by means of expensive communication adapters that sent the generator information to building control systems and eventually via a communication link to remote sites. The costs and expertise required to functionally test existing backup generator systems limited usefulness to customers and ability to provide timely service.

SUMMARY OF THE INVENTION

An electrical engine-generator set periodically runs a self diagnostic test. During that test, the engine operates at a reduced speed, i.e. less than the speed during normal power generation. Such reduced speed operation minimizes noise production, exhaust emissions, and fuel consumption during the diagnostic test.

The engine-generator set is operated at a plurality of reduced speeds. At those speeds, operating parameters are sensed and compared to reference values that are expected to occur at the associated speed. The values are stored in memory of the controller and website database for later review. Deviation between an actual parameter value and the corresponding reference value or a range of satisfactory values, i.e. a sub-optimal parameter value, causes a fault indicator to be set. The reference value may be set at the factory or adjusted over time based on historical data. The problem is reported using the Internet for user notification, service, and repair as well as displayed locally on the controller.

For example, the engine operating parameters may include engine-generator set speed, engine lubricant oil pressure, coolant level, battery voltage, and engine temperature. One skilled in the arts will understand that additional sensors can be added for other operating parameters depending on engine-generator set design and customer usage.

Another embodiment on the present diagnostic method also operates the engine-generator set at the nominal operating speed to verify proper operation under that condition. At that nominal, or normal, operating speed, the generator is excited to produce electricity. The engine operating parameters are measured at this time. In addition electrical characteristics of the generator, such as output voltage, output current, and electrical frequency, for example, also are measured. Any sub-optimal engine operating parameter or electrical characteristic produces a fault indication to persons responsible for the operation of the engine-generator set. As a further variation, the generator may be excited when operated a less than the nominal operating speed and the generator output measured for diagnostic purposes.

As another example, when a transition in engine speed occurs during the diagnostic procedure, a throttle test also may be conducted to measure how quickly and smoothly the engine reaches the new speed.

DETAILED DESCRIPTION OF THE INVENTION

Figure 1:
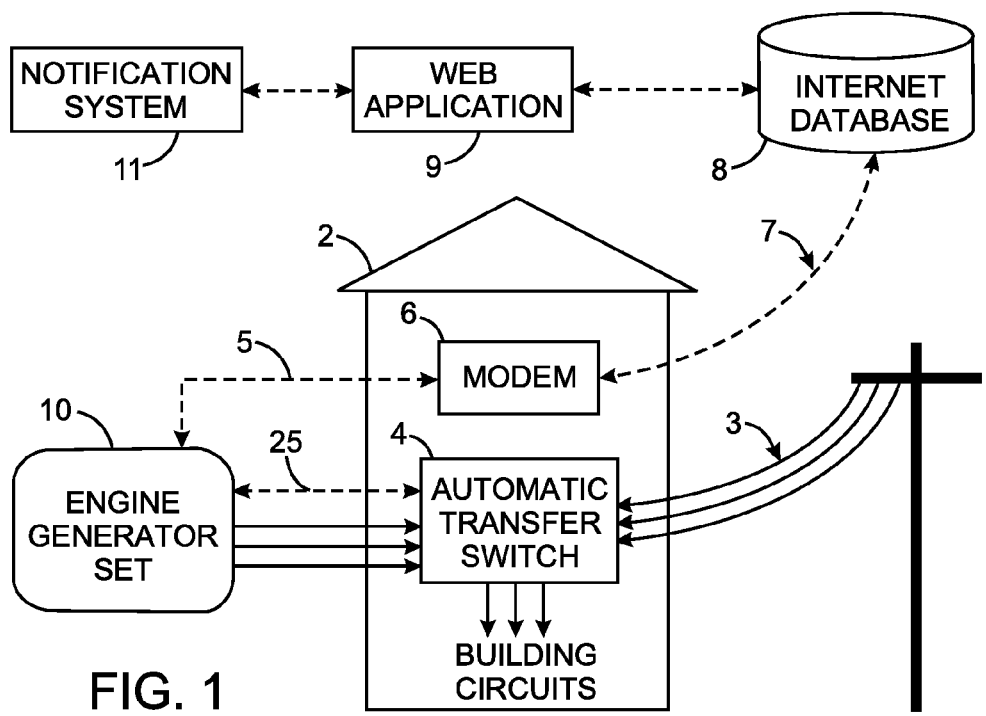
FIG. 1 is a pictorial depiction of an engine-generator set connected to an electrical system of a building.

With initial reference to FIG. 1, a building 2 receives electricity from lines 3 of a utility company. Those utility lines 3 are connected to the electrical circuits of the building 2 by a conventional automatic transfer switch (ATS) 4. An engine-generator set 10 (genset) also is connected to the automatic transfer switch 4 which feeds electricity to the building circuits when electricity is unavailable from the utility company. An interruption of electricity from the electric utility company is automatically sensed by an automatic transfer switch 4 which sends a signal indicating that event to the engine-generator set 10. That signal causes the engine-generator set to start and upon reaching the operating state, the automatic transfer switch 4 disconnects the building's electrical circuit from the utility lines 3 and connects that wiring to the output of the engine-generator set.

The engine-generator set 10, or more precisely a computerized controller therein, is connected via an Ethernet communication link 5 to a modem 6 which in turn is connected via the Internet 7 to a database 8 for the exchange of data. The Internet and database connection enables web applications 9 to access information about the operation of the engine-generator set 10 and a notification system 11 alerts remotely located personnel when servicing of the engine-generator set is required. One skilled in the art would appreciate that other communication links, such as a wireless link or a telephone network, can be used for bidirectional communication between the engine generator and a remote site. Such an alternative communication link would be used wherever communication via the Ethernet and the Internet are mentioned herein.

Figure 2:
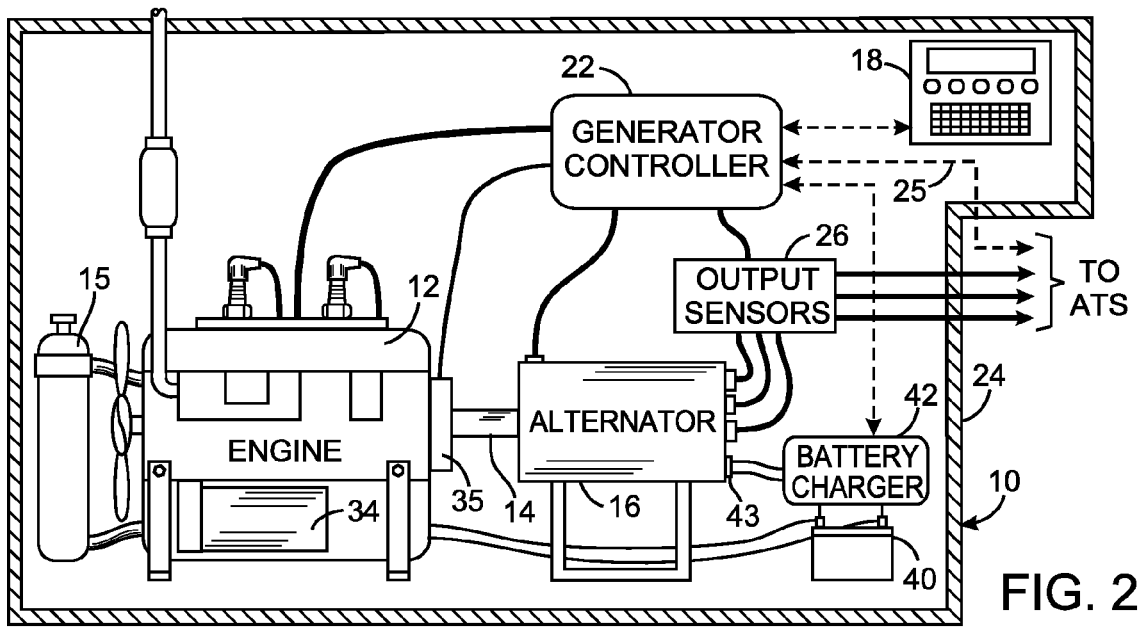
FIG. 2 is a block diagram of the components of the engine-generator set that employs the present diagnostic method.

Referring to FIG. 2, an engine-generator set 10 comprises an engine 12 coupled by a shaft 14 to an electrical generator, which in this embodiment is an alternator 16 that produces alternating current. The signal from the automatic transfer switch 4 indicating utility power interruption is received via sense/control line 25 by a generator controller 22 that responds by activating the starter 34 of the engine 12. The generator controller 22 is a microcomputer based subsystem that executes a control program which governs the operation of the engine 12 and the alternator 16 to ensure that electricity having the desired characteristics is produced. In response to sensing the actual electrical characteristics, the generator controller 22 employs a conventional voltage regulation technique to provide an excitation voltage to the field coils of the alternator. By selectively varying the excitation voltage, the output voltage produced by the alternator 16 can be regulated to a desired nominal level in a known manner. The generator controller 22 also governs the speed of the engine 12 to ensure that the alternating electricity has the proper frequency. Alternatively, separate controllers can be used for the alternator and the engine in which case those controllers communicate with each other.

Figure 3:
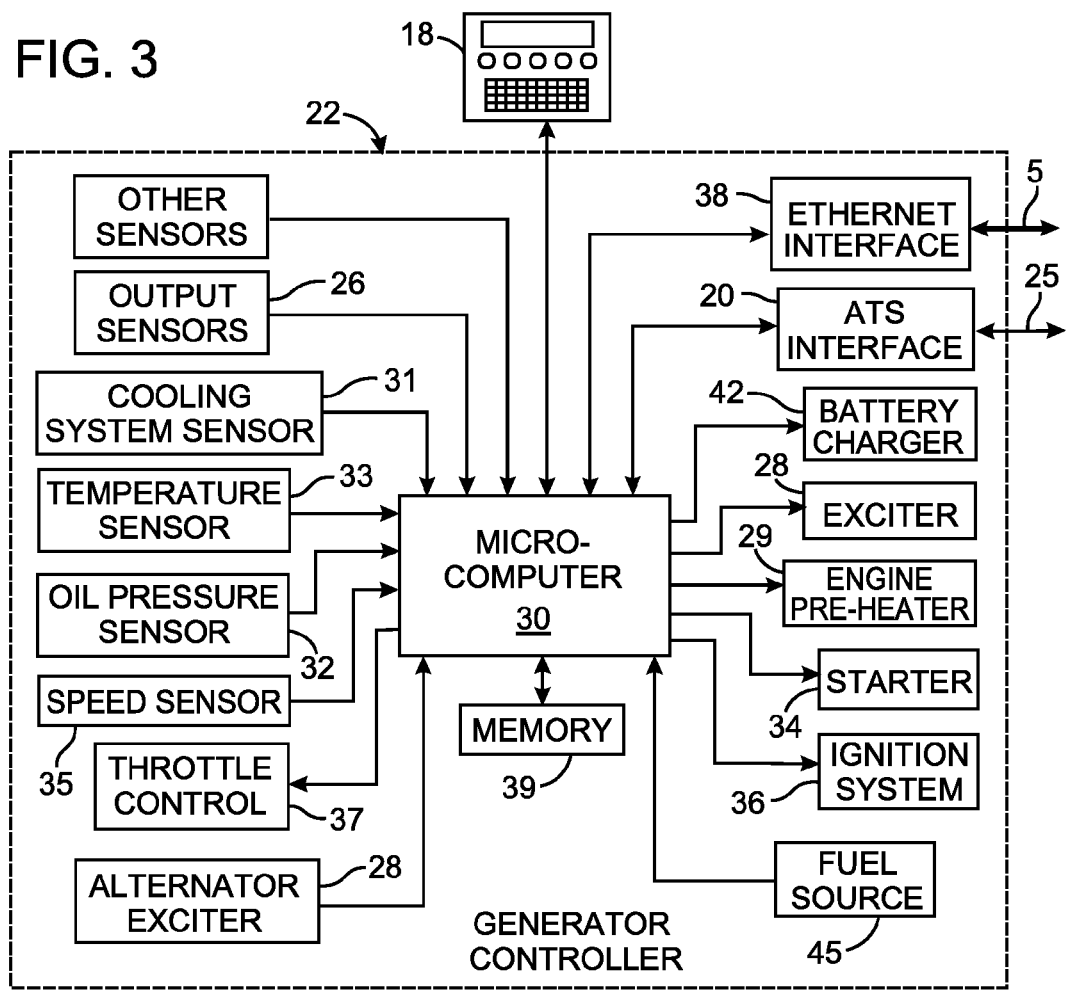
FIG. 3 is a block diagram of a generator controller in FIG. 2.

With further reference to FIG. 3, the generator controller 22 incorporates a microcomputer 30 which includes a memory that stores a control program and data for operating of the engine 12 and the alternator 16. The microcomputer 30 has circuits for receiving input signals from components on the engine-generator set 10 and for producing output signals to control other devices which govern operation of that apparatus. For example, input signals are received from several sensors on the engine 12, such as an oil pressure sensor 32 and an engine temperature sensor 33 that senses either the temperature of the lubricant fluid or the temperature of the engine block. If the engine is not air cooled, additional sensors 31 detect operating parameters of the cooling system 15 for the engine. An engine speed sensor 35 also provides an input signal to the generator controller 22. Other input signals are received from the alternator output sensors 26 and sensors in the battery charger 42 which detect operating parameters. Other sensors commonly found on engine-generators sets also provide input signals to the generator controller 22. The various operating parameters of the respective components are related to time variant attributes of those components. Another microcomputer circuit enables communication with an operator control panel 18.

The generator controller 22 produces output signals that control the engine starter 34, the ignition system 36, an engine preheater 29, a throttle control 37 that varies the speed of the engine, as will be described. Other output signals control operation of the alternator exciter 28.

Internal Ethernet interface circuit 38 enables the generator controller 22 to be directly connected to the Internet 7 via the modem 6. The microcomputer 30 also is coupled via an ATS interface circuit 20 and the sense/control line 25 to the automatic transfer switch 4.

A specific example of a generator controller 22 is described in U.S. Pat. No. 6,555,929, which description is incorporated by reference herein.

As noted above, it is not unusual for this backup engine-generator set 10 to stand idle for long periods of time. Periodically during such idle time, a diagnostic routine is automatically performed by the control system of the engine-generator set 10. At a predefined time interval after a previous diagnostic test, as indicated by a real-time clock, the microcomputer 30 in the generator controller 22 begins executing the diagnostic routine. Alternatively execution of the diagnostic routine can be initiated by a command from the ATS 4 or from a remote control device via the Internet 7. The diagnostic routine checks various operating parameters, such as regulation of the alternator output voltage, the engine battery and its charging system, cooling of the engine, pressure of the engine lubricating oil, the mechanical throttle control of the engine speed and other features and attributes of the engine-generator set. In addition, the diagnostic routine intelligently determines the amount of time required to properly warm up the engine-generator set prior to testing and can vary the amount of time required to cool down the engine afterward.

In order to minimize, the noise level, exhaust emissions, and fuel consumption during the diagnostic test, the engine-generator set 10 is operated at full speed for only a brief period of time. Instead, many of the diagnostic tests are performed at reduced speed operation. Because those tests are performed at reduced speed, the engine operating parameters (e.g. temperature and oil pressure) may not be the same as during operation at the nominal speed used to generate electricity. The operating parameters of the alternator 16 also are different throughout the reduced speed operation. Therefore, during the diagnostic testing, the measured operating parameters of the engine 12 and the alternator 16 are compared to predefined and historical values that are expected at reduced speed operation.

Figure 5:
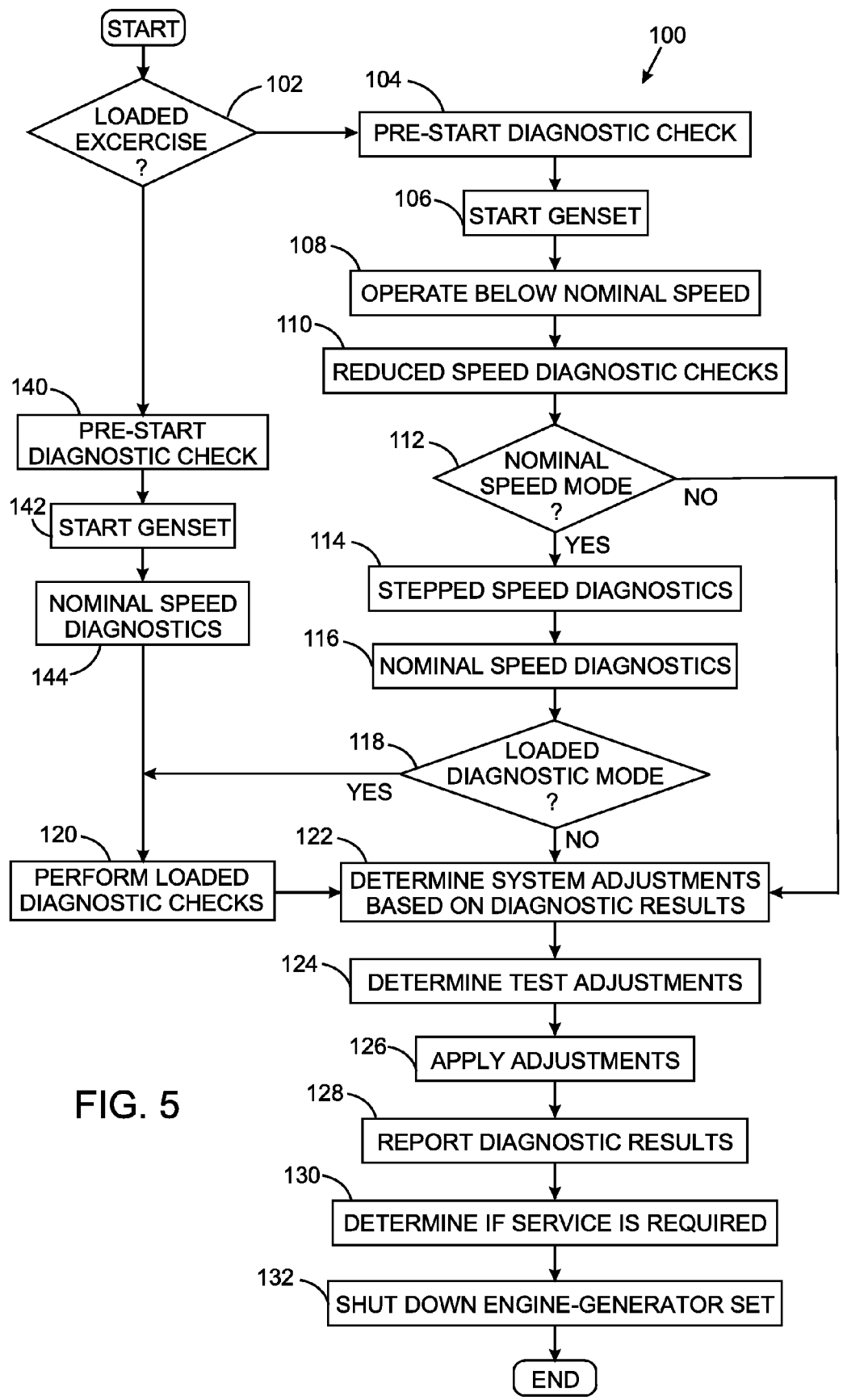
FIGS. 5-11 form a flow chart of the diagnostic software executed by the generator controller.

With reference to FIG. 5, the generator controller 22 commences executing a software diagnostic routine 100 either in response to the occurrence of a predefined time, such as once a week or once a month, receipt of a command from the automatic transfer switch 4, or receipt of a command sent from a remote location via the Internet 7. In response to that triggering event, the diagnostic routine 100 commences at step 102 at which the command is inspected to determine whether it specifies that the diagnostics are to be performed only when the engine-generator set 10 is operating under an electrical load. In that situation, the diagnostic routine branches through steps 140, 142 and 144 to step 120. Assume, however, that a full diagnostic process is indicated by the command, in which situation, execution of the routine branches instead to step 104 to conduct a pre-start diagnostic check.

Figure 4:
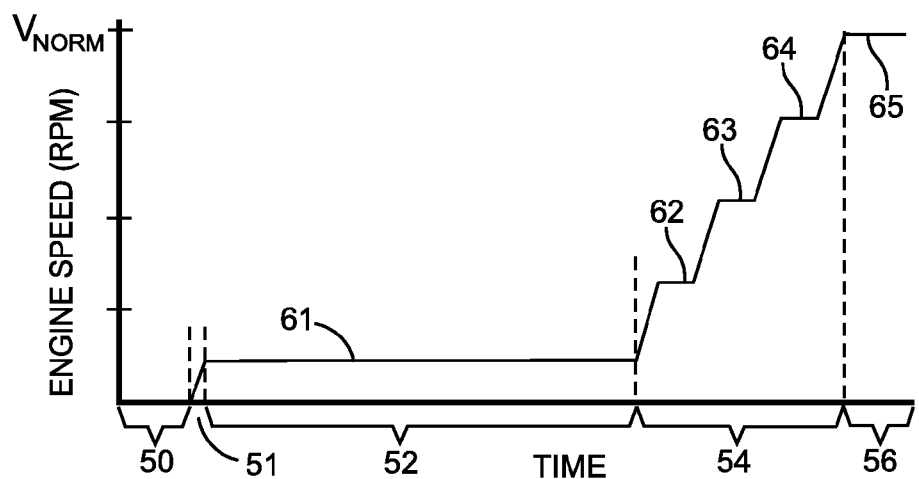
FIG. 4 is a graph showing the engine speed at different time periods during which diagnostic tests are performed.

FIG. 4 depicts the speed of the engine 12 and the alternator 16 in each of a plurality of modes of the full diagnostic routine. During an initial time interval 50, a series of tests is performed in a pre-start mode after which the engine is started at interval 51. Upon starting, the engine is operated in a slow speed mode during time interval 52 for a predefined amount of time. As an example, the predefined amount of time could be in the range of 15-20 minutes and the engine speed is 2700 RPM. Thereafter in a stepped speed mode, during interval 54 (e. g., seven minutes), the engine operates at a plurality of speeds 62-64 and at each speed a set of time variant operating parameters is measured. Finally the engine is operated at the nominal speed 65 (e.g. 3600 RPM) throughout time interval 56 during which the alternator 16 produces electricity while another set of parameter measurements is taken. Alternatively, electricity could be produced and measured when the engine-generator set 10 is operating at less than the nominal speed.

Figure 6:
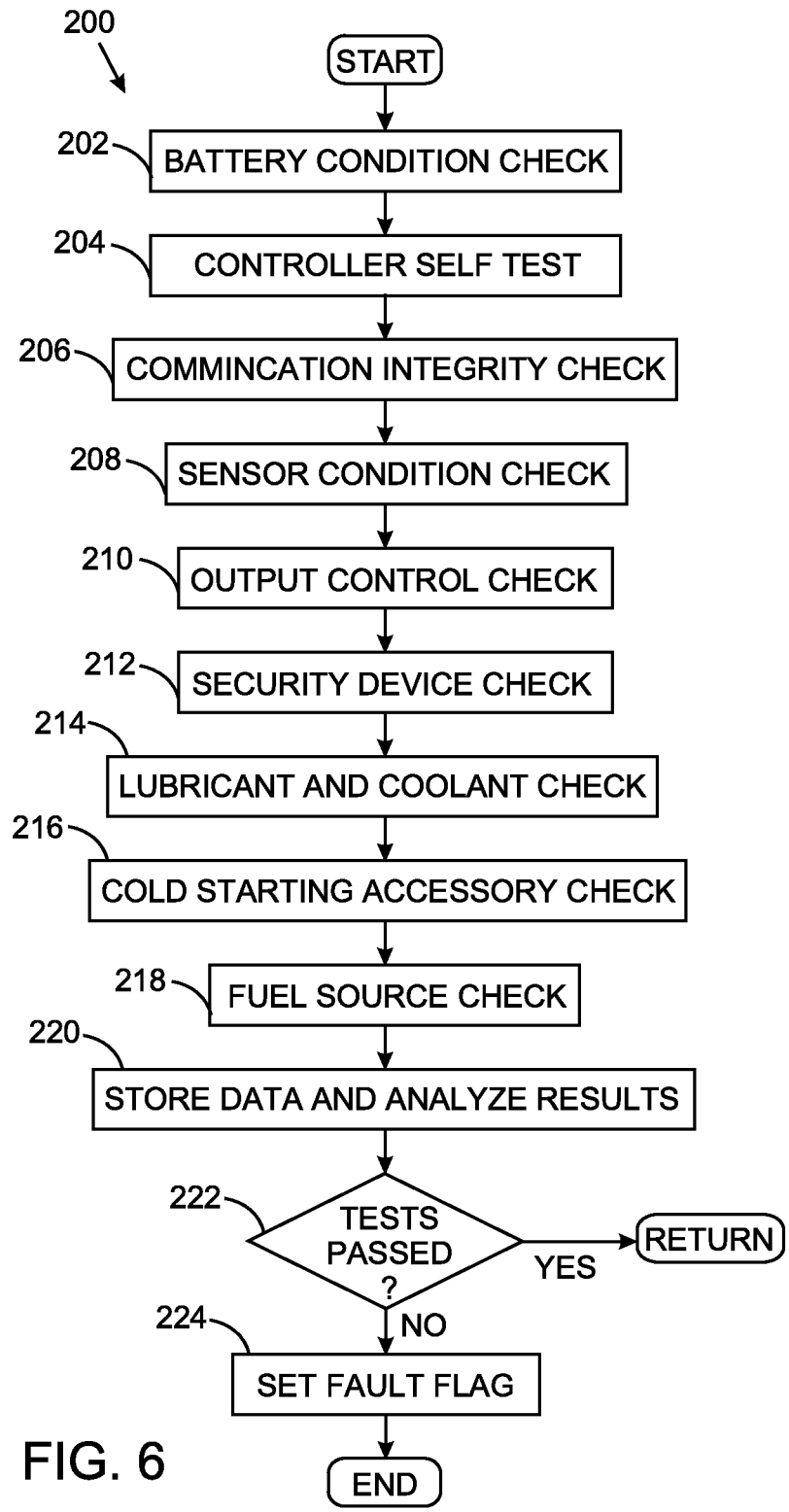

At step 104, the microcomputer 30 begins executing the pre-start mode diagnostic subroutine 200 depicted in FIG. 6. This diagnostic mode commences at step 202 with checking the condition of the battery 40 as determined by reading data from the battery charger 42 or the signals from sensors connected directly to the battery. The examination of the battery measures the voltage and internal resistance to ensure that the battery is in a condition to start and otherwise operate the engine-generator set 10. As the signal from each sensor is read and processed, the resultant data are stored temporarily in the internal memory of the microcomputer 30. At the end of each mode of the diagnostic routine, e.g. the pre-start mode diagnostic subroutine 200, the set of acquired data is stored in a permanent data file in the separate memory 39, as will be described.

After checking the battery, the diagnostic process advances to step 204 where the generator controller 22 carries out a self-check of its memory and software integrity, such as is commonly performed by computer systems. The pre-start mode diagnostic subroutine then advances to step 206 at which the microcomputer 30 conducts a communication integrity test. In the exemplary generator controller 22, this involves checking the Ethernet interface circuit 38 and communication over the Internet 7 and communication to ATS 25. In other engine-generator sets, that have separate alternator and engine controllers, this step also tests communication between those controllers. Then at step 208, the inputs of the engine-generator set 10 are inspected by the microcomputer 30 to ensure that each sensor is providing a proper input signal. Similar tests are performed on the microcomputer outputs to ensure that each has the ability to change states at step 210. Next at step 212, the microcomputer 30 inspects the signals from sensors attached to various security mechanisms on the engine-generator set 10. For example, the engine 12 and the alternator 16 are enclosed in a cabinet 24 with locked doors that have switches which provide signals indicating when the doors are open.

Thereafter, several operating parameters of the engine 12 are checked to determine if they are in satisfactory conditions for starting the engine 12. Specifically at step 214, the level, pressure, temperature, and viscosity of the engine lubricating oil and the level and specific gravity of the coolant are inspected by the appropriate sensors to determine whether these fluids are in a condition for the engine to be started. Engine-generator sets that are located outside a building often have accessories 29 that enable the engine to be started under extremely cold conditions. Such accessories include heaters for the engine coolant, lubricant oil, and intake air. The operation of these heaters is checked at step 216 by activating them and sensing whether an appropriate change in temperature occurs. A check is then made at step 218 whether the fuel source 45 is adequate, which depending upon the nature of the fuel, diesel, gasoline, natural gas, or LP gas is checked for the appropriate operating parameters, such as pressure and/or supply level.

The set of measurement data gathered in the pre-start diagnostic mode is transferred from the temporary memory in the microcomputer to the external memory 39 at step 220. That set of measurement data also is analyzed to determine whether all the time variant operating parameters have values that are within satisfactory limits, i.e. each sensed parameter value is within a range of predefined acceptable values, in order to start the engine-generator set 10. Operating parameters outside such a range are considered to be sub-optimal. If that determination at step 222 finds otherwise, the engine-generator set failed the pre-start test. This causes the subroutine execution to branch to step 224 at which a pre-start mode fault flag is set in the microcomputer memory before terminating the diagnostic routine 100. That fault flag provides an indication of an error condition or potential problem. On the other hand, if the system passes the pre-start tests, the diagnostic process returns the prestart mode diagnostic subroutine 200 to step 106 in FIG. 5.

Figure 7:
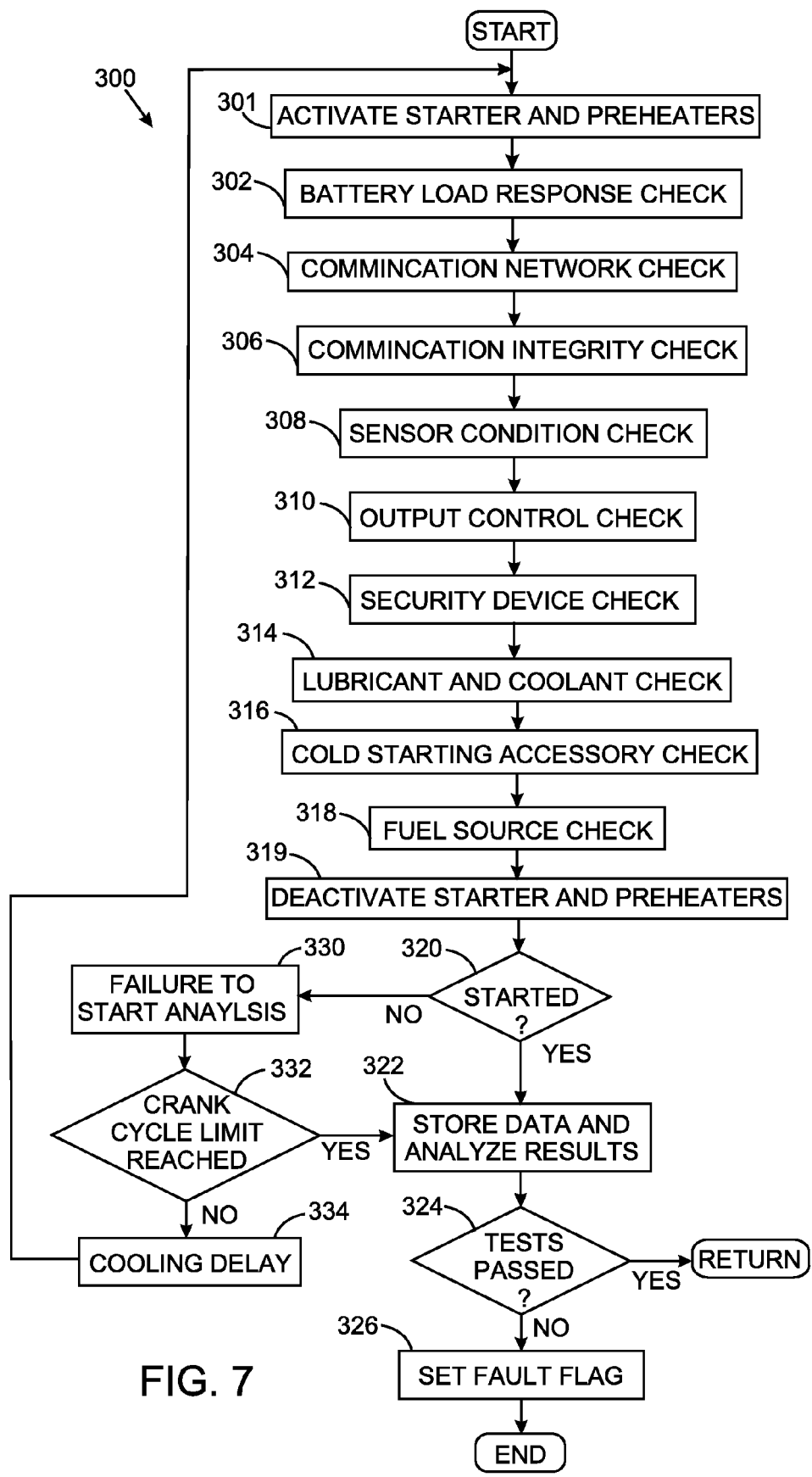

At this point, an engine start mode diagnostic subroutine 300 depicted in FIG. 7 is performed as the starter 34 is energized and the engine-generator set 10 begins rotation. During this mode, diagnostic measurements of system operating parameters are taken periodically with the gathered performance data compared to reference values in order to evaluate the engine-generator set operation.

Initially at step 301 the generator controller 22 actives the engine starter 34 and engine pre-heaters 29. Then at step 302, the battery output voltage is sensed to indicate the battery's performance under a high electrical load, as occurs when the engine starter 34, pre-heaters 29, and other electrical devices are active during an attempt to start the engine 12. The microcomputer 30 also monitors changes in the communication network 7 as indicated by the signal from the Ethernet interface circuit 38 at step 304, and whether other communication links have a satisfactory integrity at step 306.

The microcomputer 30 also performs a functional check on the various sensors at step 308 by merely determining whether each of the sensors is providing a signal that has an expected nominal value at this time. Signal processing techniques can be employed at this time to detect noisy signals or an intermittent signal that could indicate a bad connection, a failing sensor, or faulty wiring. Then at step 310, the functionality of the output circuits of the microcomputer 30 are also checked through use of internal detection circuits or feedback signals from the respective output devices. If the output functionality is questionable, the microcomputer determines at this time whether continued operation of the engine-generator set 10 can occur or whether there is a malfunction that is so critical that further operation of the engine-generator set 10 should be aborted.

At step 312, the sensor signals from the engine-generator set security mechanisms are checked at step 312 to ensure that they are properly protecting against a hazardous situation.

The lubricant oil and coolant parameters are checked again at step 314. For example, if the viscosity of the lubricant is excessively high due to low temperatures or contaminants, a longer warm-up period may be initiated. If the temperature sensor 33 indicates a very low temperature of the engine 12, the cold starting accessories are checked at step 360 to ensure that they are properly functioning. The fuel source is inspected again at step 318.

The microcomputer 30 at step 319 then de-energizes the starter 34 and the pre-heaters 29, Thereafter at step 320 a determination is made whether the engine has started. Such a determination is made by inspecting the signal from the speed sensor 35 to ascertain whether the drive shaft 14 is still turning after the starter 34 has been deactivated. If the engine has not started, the process branches to step 330 where the microcomputer 30 conducts a start failure analysis. That analysis utilizes the data acquired previously to determine whether the battery was providing sufficient electric current to drive the starter 34, if the engine was receiving adequate fuel and whether other operating parameters are within specification. The results of that failure to start analysis are stored in the memory 39.

Then at step 332, the microcomputer decides whether a limit on the number of attempts to start the engine-generator set 10 has been reached. The manufacturer or user of the engine-generator set specifies that a certain number of starting attempts, e.g., three, may occur before the diagnostic routine terminates. If the attempt limit has not been reached, the process branches from step 332 to step 334 at which the subroutine execution delays for a period of time to prevent the engine starter 34 from overheating. At the end of that delay, the engine start mode diagnostic subroutine 300 returns to step 301 where the starter 34 is activated again for another attempt to start the engine 12.

If, however, at step 332 a determination is made that the number of attempts to start the engine-generator set 10 has reached the designated limit, the process branches to step 322 at which the set of measurement data and results from any analysis of the failure to start are stored in the memory 39.

On the other hand, if at step 320 the engine 12 was found to have started, the diagnostic process branches directly to step 322 to store the data in the memory 39. In either case, the process then advances from step 322 to step 324 where a determination is made whether the engine started properly and the associated set of measurement data was within prescribed limits. If the engine-generator set 10 did not pass the start test, for example an operating parameter was sub-optimal, an start fault indication flag is set at step 326 before the diagnostic routine terminates. If the engine-generator set passed the start test, the execution returns from step 324 to step 108 in FIG. 5.

Figure 8:
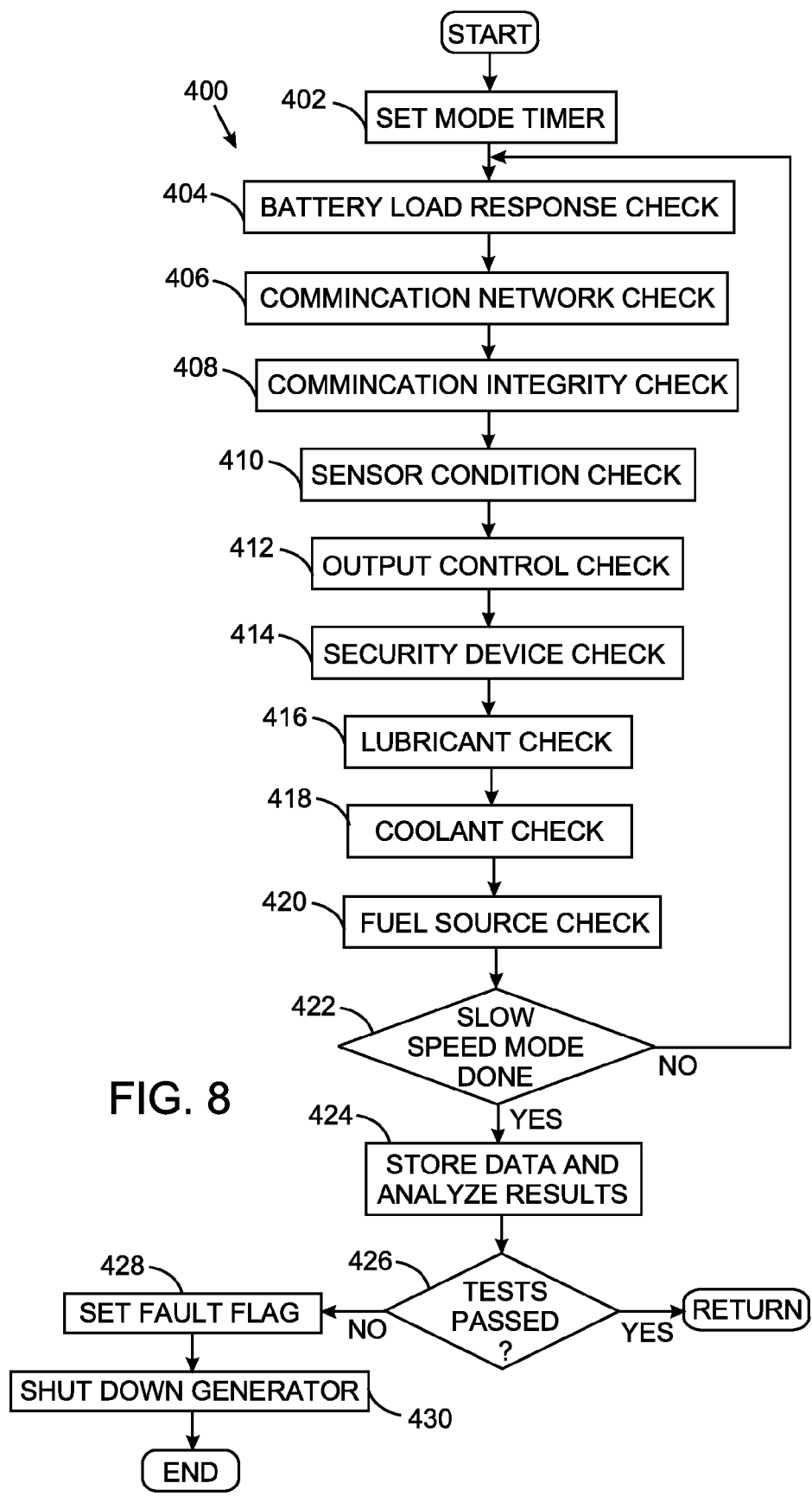

Referring again to FIG. 4, the speed of the engine 12 upon staring is set to a relatively slow first speed 61 as indicated by a plateau in the curve of engine speed versus time during the diagnostic routine 100. The engine remains at that slow speed for a time interval 52 at which additional diagnostic checks are performed at step 110 in FIG. 5. Those additional diagnostic checks are performed at this time by execution of a slow speed mode diagnostic routine 400 depicted in FIG. 8. Although in the exemplary diagnostic process electricity is not produced at this slow speed, electricity could be generated and measured at this time. During this slow speed operation, a similar set of system tests and measurements of time variant operating parameters is periodically conducted as occurred previously. The engine-generator set 10 remains at this slow speed 61 for a predefined period of time as determined by setting a mode timer at step 402. Thereafter, the microcomputer examines many of the sensors to gather data about the operating parameters of the engine 12, even though the alternator is not yet producing electricity. Specifically at step 404, the condition of the battery 40 is checked before proceeding with checks of the communication network at step 406 and system communication integrity at step 408. The general condition of all the input sensors is examined at step 410 and the output circuits are checked at step 412 as were done before. At step 414, the security mechanisms and devices on the engine-generator set are checked, as described previously, before sensing the parameters of the lubricant at step 416 and of the coolant at step 418. The functioning of the fuel source is then examined at step 420.

As an additional step at this juncture, the generator 12 may be excited to produce electricity while running at one or more of these speed steps that are less than the nominal operating speed. In that case, the electrical output of the generator is measured to produce diagnostic data. The acquired diagnostic data can be compared to values that are expected at the reduced speed to thereby provide an indication of the generator's performance.

A determination is made at step 422 whether the mode timer has expired indicating the end of the interval at which the slow speed operation is to occur. Instead of using a timer, the slow speed mode can end after a given number of passes through steps 404-420 or upon the engine 12 reaching a predefined temperature or a given value of another operating parameter. If the mode timer has not elapsed, the slow speed mode returns to step 404 to gather another set of sensor data. When the timer interval ends, the slow speed mode diagnostic routine 400 advances to step 424 where the gathered set of measurement data is stored within the memory 39 and is inspected to see if the engine-generator set is operating satisfactorily. For example, the measured value for each operating parameter can be compared to a range values that are acceptable during the slow speed mode to detect any operating parameters that are sub-optimal. If at step 426 any of the data are found to be significantly abnormal, a branch occurs to step 428 where a slow speed fault indication flag is set in the microcomputer memory and the operation of the generator set is shut down at step 430 before execution of the diagnostic routine terminates. If, however, the operating parameters were found to be satisfactory at step 426, the diagnostic procedure returns to step 112 on FIG. 5.

At this point, a determination is made whether the command which initiated the diagnostic routine specified that operation is to continue at higher speeds or whether only diagnostic tests conducted at the slow speed 61 are desired. If only slow speed diagnostics are to be performed, the program execution jumps to step 122. Otherwise, the program advances to step 114 at which operation at a series of increased speed steps is performed.

Figure 9:
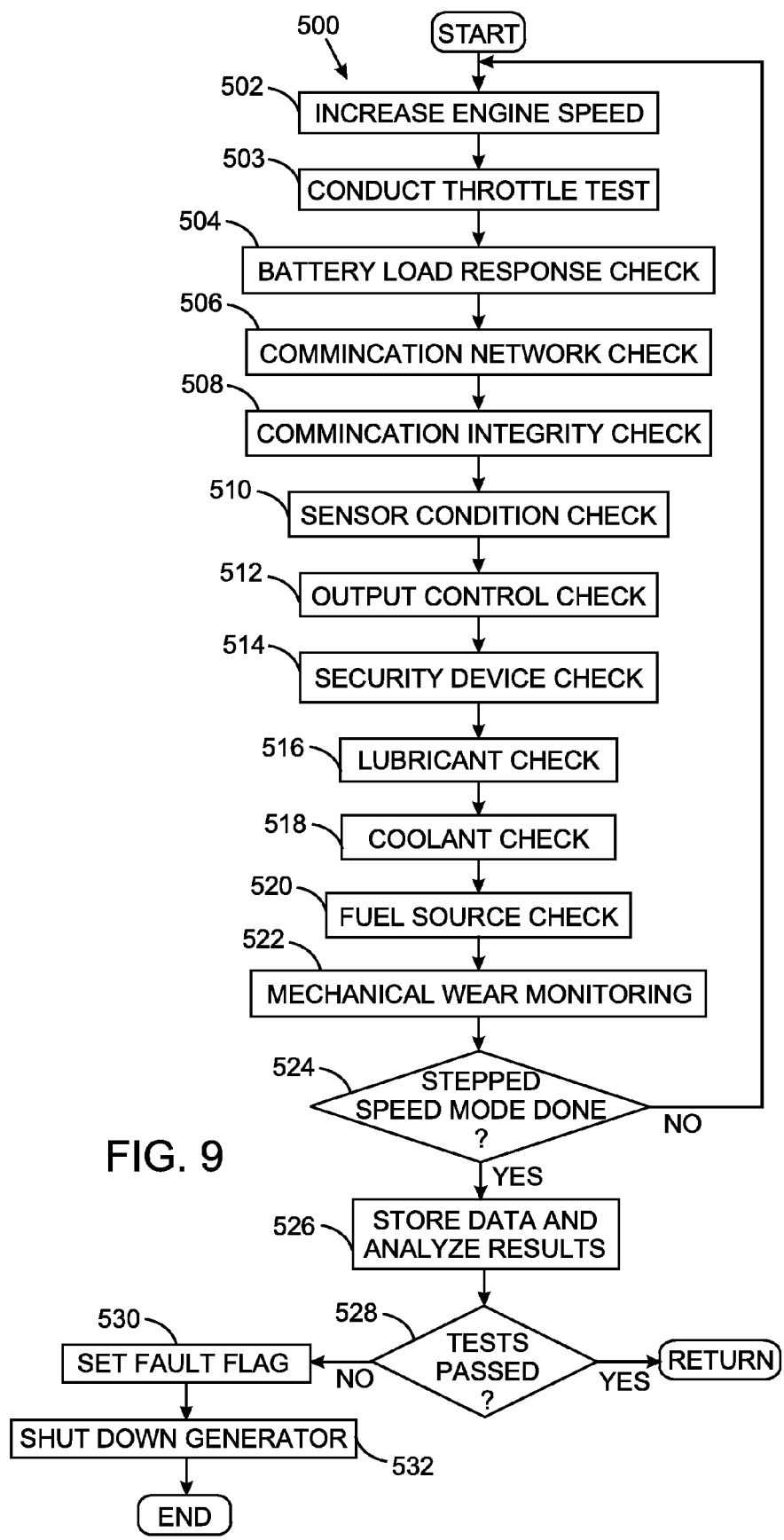

That latter operation is referred to as the stepped speed mode during which tests are carried out by a stepped speed mode diagnostic subroutine 500 depicted in FIG. 9. This subroutine 500 commences at step 502 with the microcomputer 30 commanding the engine throttle to increase the speed from the slow speed 61 to a higher speed 62 as denoted in FIG. 4. As the speed increases, the generator controller 22 conducts a throttle test at step 503, which involves the microcomputer periodically reading the actual engine speed as indicated by speed sensor 35. This produces a plurality of speed measurements until the engine 12 reaches the commanded speed 62. The length of time that it took for that speed transition to occur is compared to a maximum acceptable interval. If the actual speed transition time is outside that range, a fault indication flag is set. In addition, the plurality of speed measurements is inspected to determine how smoothly the engine made the speed transition. Significantly unequal differences among successive speed measurements may be an indicator of an engine throttle problem.

After the engine-generator set 10 reaches the new speed, the same set of parameters that was measured in previous diagnostic modes is measured again. Specifically at step 504, battery load response is checked. Then at 506, the communication network is checked followed by an integrity check of other communication links at step 508. The connections to the various sensors are then checked to ensure that signals are received from all of them. Likewise, the microcomputer outputs are checked at step 511 to ensure that state transitions can occur. The security mechanisms are inspected at step 514 and the parameters of the lubricating system and cooling systems are measured at steps 516 and 518, respectively. The fuel source and the ability to adequately supply fuel are checked via the appropriate sensors at step 520.

Mechanical wear of the engine generators components is monitored at step 522. For example, how smoothly, or uniformly, the engine-generator set 10 makes a transition between speeds may serve as an indicator of significant mechanical wear on the system. Another wear indicator is a significant fluctuation of speed, vibration, or temperatures after the engine has reached a desired speed.

At each speed 62, 63 and 64 several sets of operating parameter data may be acquired before advancing to the next speed step. A determination then is made at step 524 whether the stepped speed mode, as depicted by during time period 54 on the graph of FIG. 4, has completed. This completion is indicated by the speed of engine 12 reaching the speed 64 that occurs at the highest step of this mode. If the stepped speed mode is not complete, execution of the subroutine 500 returns to step 502 to command the engine throttle control 37 to advance to the next higher speed.

After tests of the engine-generator set 10 are conducted at the highest stepped speed 64, the stepped speed mode diagnostic subroutine 500 advances to step 526 where the set of measurements of the operating parameters acquired during steps 504-522 are stored in memory 39. That set of measurements is analyzed to determine whether the operating parameters are within the predefined ranges of values that are expected to occur at each of the speeds 62-64 and thereby detect any operating parameters that are sub-optimal. A decision is made at step 528 whether all these performance tests have been passed. If not, the program execution branches to step 530 where a stepped speed fault indication flag is set before shutting down the engine-generator set 10 at step 532, after which the diagnostic routine 100 terminates. If, however, all the operating parameters have been found satisfactory at step 528, the diagnostic routine returns to step 116 in FIG. 5.

Figure 10:
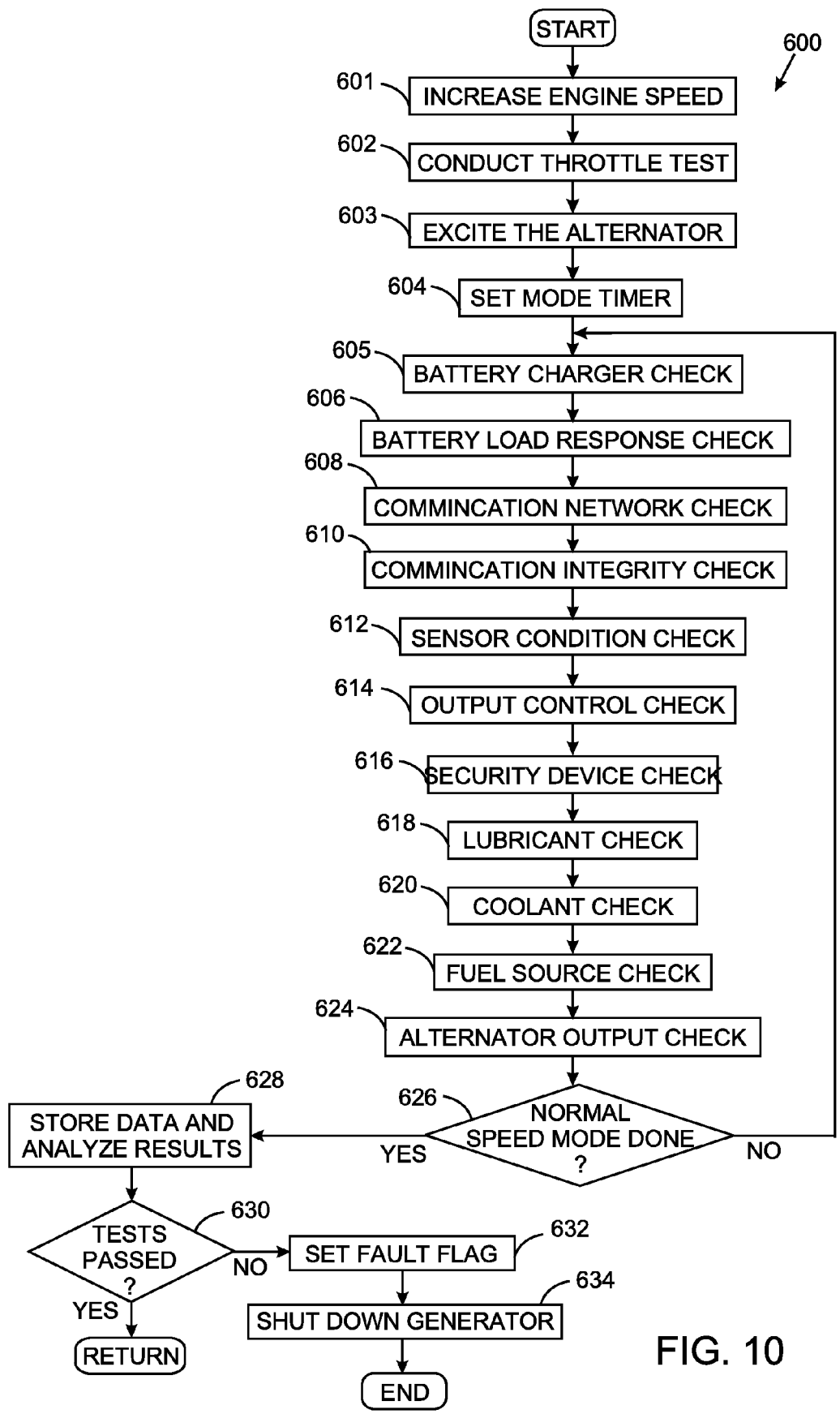

At this juncture, the diagnostic routine 100 executes a nominal speed mode diagnostic subroutine 600 as depicted in FIG. 10. This mode commences at step 601 with the microcomputer 30 commanding the engine throttle to the nominal operating speed at which the engine-generator set 10 normally runs while producing electricity. A throttle response test is conducted at step 602 to monitor how well the engine 12 responds to the command operate at the nominal speed. After the engine reaches the nominal speed, the generator controller 22 activates the exciter 28 at which time the alternator 16 begins producing electricity at step 603. Then a timer is set at step 604 for the length of time that the engine-generator set 10 is to operate in the nominal speed mode.

Thereafter at steps 605-622, the standard set of tests and data monitoring described previously is performed again. In addition, at step 624, the output sensors 26 are read to gather voltage, current, and frequency data regarding the electricity being produced by the alternator 16. These measurements subsequently can be compared to the nominal values for these electrical characteristics to determine whether the alternator 16 is operating satisfactorily. During this step of the nominal speed mode diagnostic subroutine 600, the generator controller 22 sequentially commands a plurality of output voltage levels from the alternator 16 by controlling operation of the exciter 28 to apply predefined excitation voltages to the field coil of the alternator 16. If the engine and alternator are operating satisfactorily, each predefined excitation voltage produces a corresponding known output voltage from the alternator. At each of these different excitation voltage levels, the generator controller 22 obtains a measurement of the actual alternator output voltage from output sensors 26 and compares that measured voltage to the expected output voltage. A discrepancy between the actual and expected output voltage may be indicative of a fault condition.

Then at step 626 the timer is inspected to see if the operating period for the nominal speed mode has elapsed. If not, the program execution returns to step 605 to continue monitoring the engine-generator set operation in this mode.

When the nominal speed mode ends, the diagnostic process advances to step 628 where the set of parameter measurement data is stored and analyzed to determine whether the engine-generator set 10 is operating satisfactorily. If a determination is made at step 630 that the system has not passed all the diagnostic tests, e.g. because one or more parameter value is sub-optimal, a nominal speed fault indication flag is set at step 632 before the engine-generator set 10 is shut down at 634. In this event, the diagnostic routine then terminates. Otherwise, if the engine-generator set 10 passed all the tests in the nominal speed mode, the program execution returns to step 118 on FIG. 5.

Figure 11:
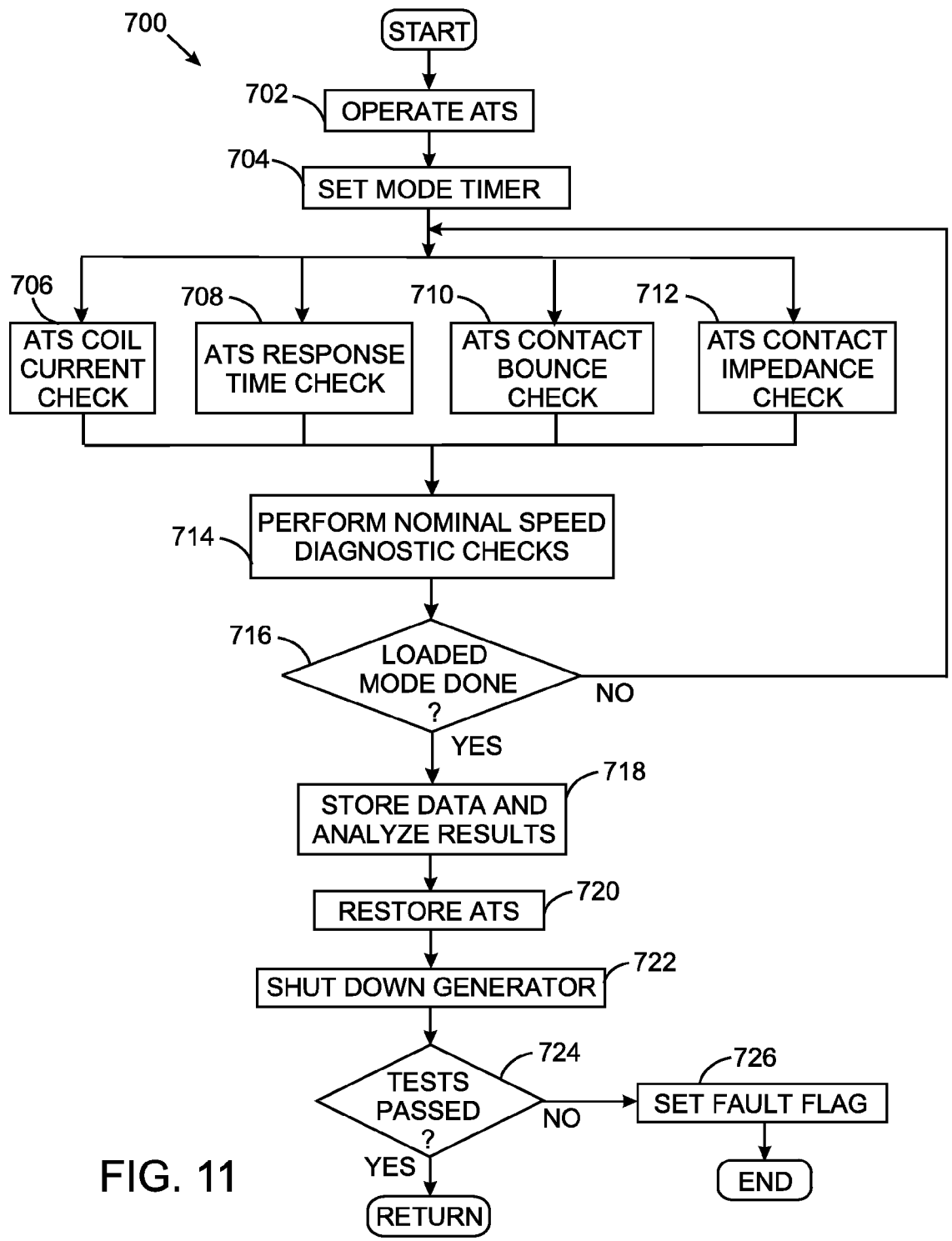

At step 118, a determination is made whether the command that initiated the diagnostic routine indicated that tests also were to be performed with an electrical load connected to the output of the alternator 16. In other words, whether the automatic transfer switch 4 should connect the output of the engine-generator set 10 to the building electrical circuits. If that is desired, the diagnostic process branches to step 120 where the loaded mode diagnostic subroutine 700 shown in FIG. 11 is executed. Note that the loaded mode diagnostic subroutine also entered via a branch from step 102 after executing the pre-start mode diagnostic subroutine 200 at step 140, starting the engine-generator set at step 142 and executing the nominal speed mode diagnostic subroutine 600 at step 144.

With reference to FIG. 11, the loaded mode diagnostic subroutine 700 commences at step 702 with the generator controller 22 sending a command to activate the automatic transfer switch 4 so that the output of the engine-generator set 10 is connected to the electrical circuits in the building 2. Then a mode timer is initiated at step 704 to define the time period that the engine-generator set will operate in the loaded mode.

Next at steps 706-712, signals, received by the generator controller 22 from the automatic transfer switch 4, are inspected to determine various operating parameters of that switch. Specifically at step 706, an analog signal indicating the level of current applied to the electromagnetic coil of the ATS is examined to determine whether the current is within an acceptable range. At step 708, the length of time between when the activation command is sent to the automatic transfer switch and when the switch contacts close connecting the generator set to the building circuits is examined. This length of time is indicated by the difference in the values of the mode timer at each of those events. Here too, a determination is made whether this response time of the automatic transfer switch is within an acceptable range. At step 710, the signals from the automatic transfer switch 4 are examined to determine whether unacceptable bounce of the switch contacts occurred as indicated by the current flow from the alternator 16 to the building circuits being repeatedly interrupted. At step 712, the contact impedance of the automatic transfer switch is determined by sensing the impedance across the ATS position sensing contacts. The present impedance value can be compared to impedance measurements taken during prior executions of the diagnostic routine to detect a significant change in that impedance. At this step the signal indicating the temperature of the ATS also is read and stored temporarily in the microcomputer's memory.

At step 714, the nominal speed mode diagnostic subroutine 600 is called to measure the system operating parameters with the engine-generator set 10 functioning under an electrical load. Thereafter, at step 716, the timer is inspected to determine whether the loaded mode has finished. If not, the subroutine execution returns to once again check the signals received from the automatic transfer switch 4 at step 706-712.

When the loaded mode is complete, the subroutine execution advances to step 718 where the acquired set of parameter measurement data is stored in the memory 39. Then at step 720, the ATS is restored to the state at which the utility lines 3 are connected to the building circuits and the alternator output is disconnected. The engine-generator set 10 then is shut down at step 722. If an analysis of the measured data acquired in the loaded mode determines that any of the data is outside its respective satisfactory range at step 724, e.g. because one or more parameter value is sub-optimal, the diagnostic process branches to step 726 at which a loaded mode fault indication flag is set.

If at step 724 the system is found to have passed the tests, the diagnostic procedure returns to step 122 in FIG. 5. At this point, the diagnostic data are inspected to determine whether the operation of the engine-generator set 10 needs to be adjusted. For example, if the diagnostic tests were run under extreme cold conditions and the viscosity of the engine lubricant did not reach an acceptable level soon enough, the preheating of the engine lubricant may be altered to hasten reaching an acceptable viscosity level. In another instance, the responsiveness to the engine throttle to the diagnostic speed change commands may be used to adjust the throttle commands issued during normal operation of the engine-generator set.

At step 124, a similar inspection of the acquired diagnostic data is employed to determine whether the characteristics of the diagnostic routine 100 and its subroutines need to be changed. For example, under cold weather conditions, the time interval 52 of the slow speed mode may have to be lengthened in order to warm up the engine adequately before higher speed operation commences. Then at step 126, the various adjustments to the normal operating and diagnostic characteristics are implemented by setting the appropriate variables in the memory 39 of the generator controller 22.

At step 128, the results of the diagnostic tests and the analysis of the data acquired therein, along with any resultant operating parameter changes, are sent via the Ethernet interface circuit 38 and the Internet 7 to the Internet database 8 for access by remote web applications 9. This enables service personnel at remote locations to access the diagnostic data at step 130 in order to determine whether servicing of the engine-generator set 10 is required. Then at step 132, the engine-generator set 10 is shut down after which the diagnostic routine terminates until it is commanded to run again.

The foregoing description was primarily directed to a certain embodiments of the invention. Although some attention was given to various alternatives, it is anticipated that one skilled in the art will likely realize additional alternatives that are now apparent from the disclosure of these embodiments. Accordingly, the scope of the coverage should be determined from the following claims and not limited by the above disclosure.

The invention claimed is:

1. A method for performing a diagnostic test on a backup power system, the method comprising:
    executing, by a controller, a diagnostic routine that starts and controls a stationary electrical backup system that includes a generator and an internal combustion engine that drives the generator to produce electricity, wherein the diagnostic routine controls the internal combustion engine to operate at a plurality of predefined speeds;
    at each of the plurality of predefined speeds, measuring at least one operating parameter of the stationary electrical backup system to produce a first set of measurements; and
    analyzing the first set of measurements to produce a first indication of an operating condition of the stationary electrical backup system,
    wherein the generator is desired to operate at a nominal speed while supplying alternating current (AC) electricity to an electrical load, and further comprising:
        operating the internal combustion engine at the nominal speed;
        upon operating at the nominal speed, activating the generator to produce AC electricity;
        measuring a characteristic of the AC electricity; and
        analyzing a measurement of the characteristic of the AC electricity to produce a second indication of the operating condition of the stationary electrical backup system.

2. The method as recited in claim 1 further comprising: prior to controlling the internal combustion engine, measuring a parameter of the stationary electrical backup system to produce a second set of measurements; and analyzing the second set of measurements to produce a second indication of the condition of stationary electrical backup system.

3. The method as recited in claim 2 wherein when the second indication designates a fault condition of the stationary electrical backup system, the method avoids operating the internal combustion engine.

4. The method as recited in claim 2 further comprising prior to controlling the internal combustion engine sensing an operational status of a device that assists the internal combustion engine staring when an ambient temperature is below a given temperature.

5. The method as recited in claim 1 wherein the internal combustion engine is initially operated at a slowest of the plurality of predefined speeds for a defined period of time.

6. The method as recited in claim 5 wherein the defined period of time extends until an operating parameter of the internal combustion engine has a predetermined value.

7. The method as recited in claim 1 wherein the at least one operating parameter is selected from the group consisting of a cooling system parameter, a lubricating system, a battery parameter, and a fuel source parameter.

8. The method as recited in claim 1 wherein analyzing the first set of measurements comprises comparing each measurement of an operating parameter to a respective reference value.

9. The method as recited in claim 1 wherein analyzing the first set of measurements further comprises indicating a fault condition when any measurement of a given operating parameter in the first set is outside a predefined range of values for that given operating parameter.

10. The method as recited in claim 1 further comprising measuring a response of the internal combustion engine to a command to change from one predefined speed to another predefined speed.

11. The method as recited in claim 1 wherein the characteristic of the AC electricity is selected from the group consisting of voltage, current, and frequency.

12. The method as recited in claim 1 further comprising: while the generator is producing AC electricity, measuring at least one operating parameter of the internal combustion engine to produce a second set of measurements; and analyzing the second set of measurements to produce a third indication of the operating condition of the stationary electrical backup system.

13. The method as recited in claim 1 wherein at least one of the first set of measurements and results of analyzing the first set of measurements is sent to a remote location over the Internet.

14. A method for performing a diagnostic test on an engine-generator set which includes an internal combustion engine that drives a generator of electricity, the generator operates at a nominal speed while supplying electricity to electrical loads, the method comprising:
   operating the engine-generator set in a stepped speed mode during which:
      a) the internal combustion engine operates at each of a plurality of predefined speeds for predefined periods of time, and
      b) at each of the plurality of predefined speeds, a first set of operating parameters of the engine is measured to produce a first set of measurements;
   operating the engine-generator set in a nominal speed mode during which:
      c) the internal combustion engine operates at the nominal speed, and
      d) a second set of operating parameters of the engine is measured to produce a second set of measurements; and
   analyzing the first and second sets of measurements to produce an indication of an operating condition of the engine-generator set;
   wherein the stepped speed mode is different from the nominal speed mode.

15. The method as recited in claim 14 further comprising, prior to operating the engine-generator set in a stepped speed mode, operating in a pre-start mode during which a third set of operating parameters of the engine-generator set are measured before starting the engine, thereby producing a third set of measurements.

16. The method as recited in claim 15 further comprising, when the third set of measurements indicates a fault condition, the method avoids operating the internal combustion engine.

17. The method as recited in claim 14 further comprising sending the first and second sets of measurements to a remote location over the Internet.

18. The method as recited in claim 17 wherein the first and second sets of measurements are sent to a remote location over the Internet.

19. The method as recited in claim 14 wherein analyzing the first set of measurements comprises comparing each measurement of an operating parameter to a respective reference value.

20. The method as recited in claim 14 wherein each of the first and second sets of operating parameters has at least one parameter selected from the group consisting of a cooling system parameter, a lubricating system, a battery parameter, and a fuel source parameter.

21. The method as recited in claim 14 further comprising measuring a response of the engine to a command to change from one predefined speed to another predefined speed.

22. The method as recited in claim 14 further comprising while the internal combustion engine operates at the nominal speed, exciting the generator to produce electricity and measuring a set of characteristics of the electricity to produce a set of characteristic measurements.

23. The method as recited in claim 14 wherein the second set of operating parameters includes a parameter of an automated transfer switch connected with the engine-generator set and a utility power source.

24. The method as recited in claim 14 further comprising analyzing the first and second sets of measurements; and in response thereto reconfiguring operation of the engine-generator set in at least one of the stepped speed mode and the nominal speed mode.

25. A power generation system comprising:
   an engine;
   an alternator in connection with the engine; and
   controller comprising a control program and a microprocessor to run the control program, the controller operable:
      to operate and maintain the engine at a first speed;
      to conduct a diagnostic test while the engine operates at the first speed;
      to identify a first speed termination event, the first speed termination event occurring at an expiration of a predetermined period of time, at completion of an executed routine a predetermined number of times, or at a measurement of a parameter that reaches a predetermined value;
      to operate and maintain the engine at a second speed when the first speed termination event is identified, and
      producing an indication of an operating condition of the power generation system based on the diagnostic test.

* * * * *